United States Patent [19]

Block

[11] 4,269,549
[45] May 26, 1981

[54] METHOD FOR DRILLING CIRCUIT BOARDS

[75] Inventor: James P. Block, Long Beach, Calif.

[73] Assignee: LCOA Laminating Company of America, Garden Grove, Calif.

[21] Appl. No.: 61,592

[22] Filed: Jul. 30, 1979

[51] Int. Cl.³ .............................................. B23B 35/00
[52] U.S. Cl. ..................................... 408/1 R; 83/658; 408/87
[58] Field of Search ............ 408/1, 11, 14, 58, 241 R, 408/87; 83/658

[56] References Cited
U.S. PATENT DOCUMENTS

| | | | |
|---|---|---|---|
| 3,700,341 | 10/1972 | Block | 408/1 |
| 3,719,113 | 3/1973 | Gerber et al. | 83/658 X |
| 3,781,124 | 12/1973 | Bodycomb et al. | 408/87 X |

*Primary Examiner*—William R. Briggs
*Attorney, Agent, or Firm*—Edward A. Sokolski

[57] ABSTRACT

Backup material is formed from a pair of oppositely positioned metallic foil sheets between which an open metallic core having oppositely running node portions is sandwiched. The core may be sinusoidal with each node extending from one of the edges of the sheets to the opposite edges. This sandwich core backup material is placed beneath a printed circuit board to be drilled, such that with drilling, the drill penetrates through the top sheet and not the bottom sheet, thus terminating in the area of the open core. The backup material prevents the formation of burrs around the holes drilled in the circuit board and at the same time facilitates cooling the drill and the workpiece and the removal of cuttings therefrom.

7 Claims, 5 Drawing Figures

METHOD FOR DRILLING CIRCUIT BOARDS

This invention relates to the drilling of printed circuit boards, and more particularly to a backup material for use in this type of operation.

In the drilling of printed circuit boards to provide apertures necessary for passing component leads therethrough and for attaching the boards in place, a problem has been encountered in that a burr is produced on the periphery of the aperture where the drill exits from the copper-clad surface. Such a burr is unacceptable in view of the fact that it forms a dam-like condition during through hole plating which can entrap contaminants or air, this often later resulting in cracking of the through hole plating and a resultant electrical failure. Such burrs thus must be removed, either by a separate sanding operation or prevented by the use of a suitable backup board, the latter approach being much more desirable in view of the fact that it is less costly and does not increase the time needed for sanding.

A particularly desirable backup board for use in circuit board drilling is described in my U.S. Pat. No. 3,700,341, issued Oct. 24, 1972, and assigned to L.C.O.A. Laminating Corporation of America, the assignee of the present application. This prior art backup board employs a core of hard pressed wood which is covered with outer layers of metallic foil (preferably aluminum). While the backup board of my aforementioned prior patent is quite effective in eliminating burrs and provides cooling of the drill, the backup board of the present invention provides a number of improvements thereover. Firstly, the backup board of the present invention, by employing a core having open spaces therein between an upper and a lower foil sheet, further facilitates the cooling of the drill and printed circuit board workpiece by virtue of the air flow provided through the core during the drilling. Further, these open spaces in the core can be employed to facilitate the removal of cuttings from the workpiece. Further, the cooling of the drill is facilitated after drilling through the workpiece in view of the fact that the drill tip enters the open core after it penetrates the upper sheet and does not penetrate the lower sheet. It is to be noted that a vacuum system is generally employed by the drilling machine for removing cuttings from the workpiece area. The core of the present invention facilitates the optimum use of such vacuum systems both for the removal of the cuttings and for additional cooling of the printed circuit board workpiece and the drill.

It is therefore the object of this invention to provide an improved backup material and method for use in drilling printed circuit boards.

It is another object of this invention to provide an improved backup board for use in drilling printed circuit boards wherein improved means are afforded for facilitating the removal of cuttings and the cooling of the workpiece and drill.

Other objects of the invention will become apparent as the description proceeds in connection with the accompanying drawings of which:

Described in brief, the backup board comprises a pair of opposing metallic foil sheets which may be of copper, magnesium or steel but are preferably of aluminum, between which is sandwiched a core member having opposing antinode portions, one of which faces against one of such sheets and the other of which faces against the other of the sheets. The antinode portions are preferably elongated running in substantially parallel lines between opposite edges of the sheets so as to form elongated channels therebetween and may be approximately in the form of a sine wave. The circuit board to be drilled is placed over the backup material with the bottom surface thereof abutting against the top sheet of the backup material. After the drill has penetrated through the workpiece, it penetrates the top sheet of the backup material and enters the core space and goes no further than this space. An air flow may be provided in the core to facilitate the removal of cuttings therefrom and to aid in the cooling of the drill and the workpiece.

Figure 1:
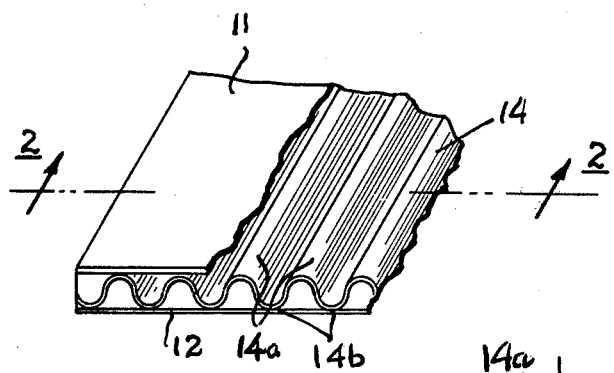
FIG. 1 is a perspective view illustrating the backup material of the invention.
Figure 2:
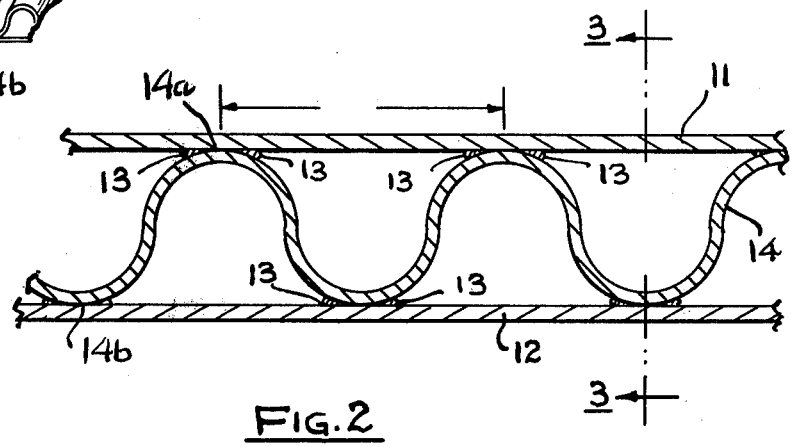
FIG. 2 is a cross-sectional view taken along the plane indicated by 2—2 in FIG. 1.
Figure 3:
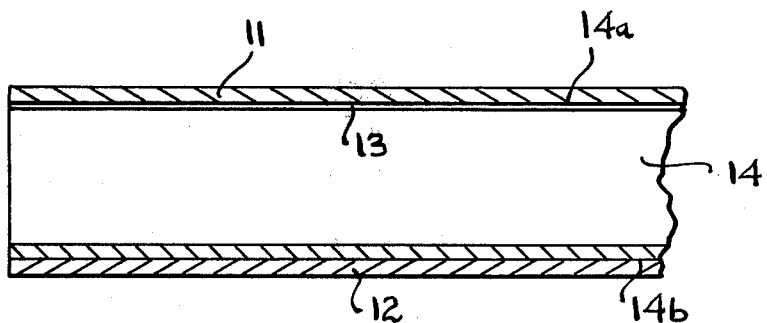
FIG. 3 is a cross-sectional view taken along the plane indicated by 3—3 in FIG. 2.

Referring now to FIGS. 1-3, a preferred embodiment of the backup material of the present invention is illustrated. The material includes an upper metallic foil sheet 11 and a lower metallic foil sheet 12, between which a sinusoidally undulating core member 14 is sandwiched. The core member 14 has opposing antinode portions 14a and 14b which face against the inside surfaces of sheets 11 and 12 respectively. Antinodal portions 14a and 14b are bonded to sheets 11 and 12 by means of a suitable bonding material 13 and run between opposite edges of the sheets, the apices of these nodel portions abutting against the sheets and running in substantially parallel lines. It has been found that aluminum foil is particularly suitable for sheets 11 and 12 and core 14.

Excellent results have been achieved with type 3003-H19 aluminum foil having a thickness of 0.005 inches for each of these components. This type of aluminum has the following constituents added to pure aluminum: silicon—6%; iron—7%; copper—0.05-0.20%; manganese—1.0-1.5%; and zinc—0.10%. Utilizing aluminum of this type with the indicated 0.005 inch thicknesses, the spacing between the inner walls of the two foils should typically be approximately 0.053 inches, making for an overall thickness of the backup material of 0.063 inches. For a backup material having an overall thickness of 0.093 inches, the top and bottom sheets and the core typically have thicknesses of 0.007 inches and for a backup material having an overall thickness of 0.125 inches, the top and bottom sheets and the core material typically have thicknesses of 0.009 inches.

Figure 4:
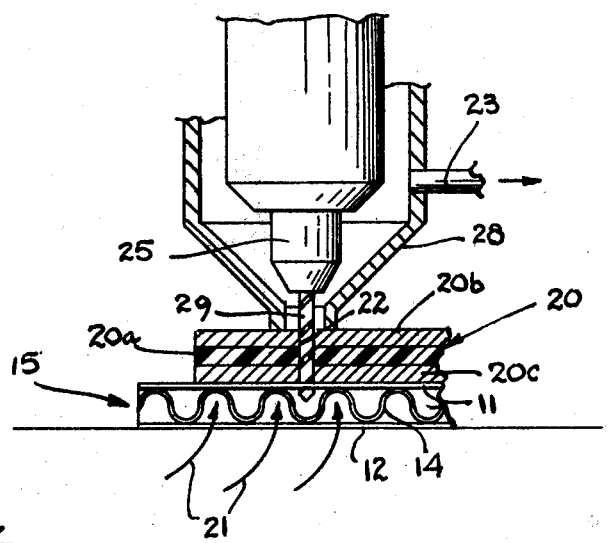
FIG. 4 is an elevational view illustrating the use of the backup material in drilling a workpiece.

Referring now to FIG. 4, the operation of the invention is schematically illustrated. Workpiece 20, which is typically a printed circuit board with an epoxy glass substrate 20a clad with copper layers 20b and 20c on both sides thereof, is placed on a piece of the backup material 15. A supply of air, indicated by arrows 21, is provided to the area of convoluted core material 14. This supply of air flows through the drill hole 22 and out through air outlet 23. The supply of air may be provided by a blower or a suitable vacuum system, the latter being present in a typical drilling machine. The drill 25 is set so that the furthest penetration of drill bit 29 will not take it beyond the area of the core material 14, i.e., it will not penetrate the lower sheet 12 of the backup material. This enables a second use of the backup material after it has been used on one side by placing the reverse unused side up towards the drill. During the drilling operation, air will flow along the flutes of the drill bit (once penetration of the workpiece 20 has occurred) and the tip of the drill will be cooled. Throughout the drilling operation, air can be circulated through the core material which further facilitates the cooling of the drill bit and workpiece. Immediately after the drill bit has been withdrawn, the air will flow through the drill hole 22 and clear away any cuttings that may be left in this immediate area.

The device as shown in FIG. 4 includes a pressure foot 28 which moves downward immediately prior to drilling and makes contact with board 20. This action ensures that the board is absolutely flat and secure when the drill makes its initial contact. When the drill has reached the desired predetermined maximum depth, which as already indicated is not beyond the core area, the drill's downward motion is automatically stopped and an upward movement is commenced. The "stop" position between downward and upward motion, known as the "dwell", is when in prior art drillings the drill usually reaches its highest temperature. When the drill has been fully extracted, a vacuum is provided at air outlet 23 which is used to remove debris from above the workpiece. The air supply 21 which is provided into the core of the backup material aids both in the cooling process and in the removal of debris, being particularly effective in this last regard for debris below and within the hole. Thus, the use of the backup material in accordance with the present invention greatly facilitates both the cooling of the workpiece and the drill and the removal of cuttings and other debris.

Figure 5:
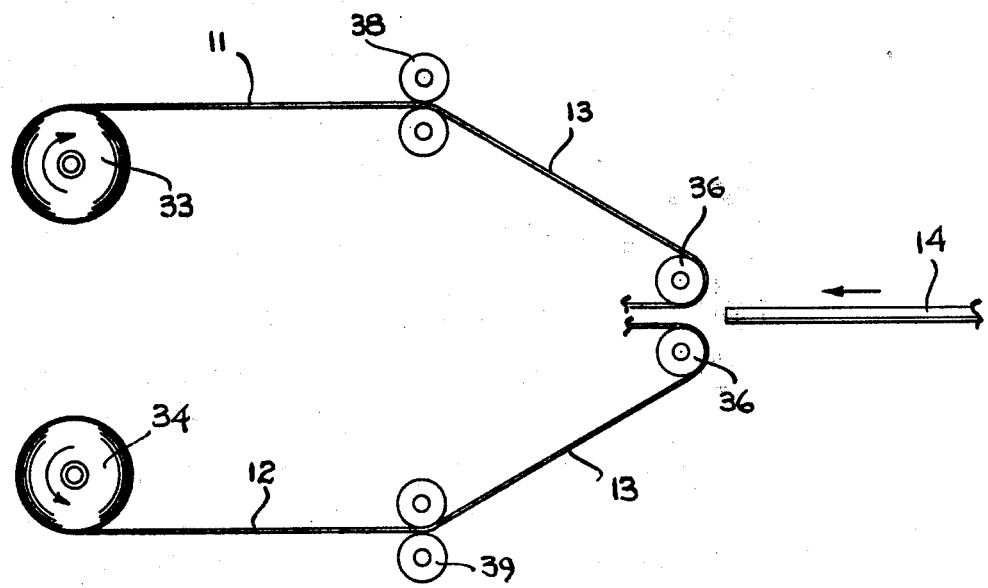
FIG. 5 is a schematic drawing illustrating the fabrication of the backup material of the present invention.

Referring now to FIG. 5, the method of fabricating the backup material used in the present invention is illustrated. First and second rolls of aluminum foil 33 and 34 are rotatably supported and are unwound by means of pinch rollers 36 to which they are fed in a wound-back relationship. Prior to reaching pinch rollers 36, the surfaces of foil sheets 11 and 12 pass through rollers 38 and 39 which coat the outer surfaces of the sheets with a layer of bonding material 13. It has been found that an epoxy resin adhesive bonding agent having a 50—50 composition of epoxy and hardener provides a suitable bonding agent. Simultaneously passed through the pinch rollers sandwiched between sheets 11 and 12 is the sinusoidally undulated core material 14. The sinusoidal undulations of core material 14 can be formed in flat sheets of the foil by means of a suitable pair of forming rollers. Typically, the undulations are formed so that the nodes thereof run substantially parallel to each other along the longitudinal dimension of the core. Typically, a 0.002 inch layer of bonding material 13 is provided to each of the metallic foil sheets. After the sandwich core material is passed through pinch rollers 36, final bonding is effected at a pressure of 25–325 psi (50 psi being found optimum in the preferred embodiment) at a temperature of 125°–550° F. (240° F. being found optimum in the preferred embodiment), this end result being achieved by placing the material between a pair of tooling or "caul" plates which are then placed in a heated laminating press where the above indicated heat and pressure are applied.

While the invention has been described and illustrated in detail, it is to be clearly understood that this is intended by way of illustration and example only and is not to be taken by way of limitation, the spirit and scope of this invention being limited only by the terms of the following claims.

I claim:

1. A method for drilling a printed circuit board comprising
    placing beneath the circuit board, backup material comprising an open core member having at least one sheet attached to one side of said core member, the core member forming elongated channels running between opposite edges of said sheet, and
    drilling through the printed circuit board and said one sheet of said backup board,
    after drilling through said one sheet of said backup board ending the travel of the drill in the area of the core member.

2. The method of claim 1 wherein there are a pair of said sheets opposite each other between which the core member is sandwiched.

3. The method of claim 2 wherein the backup board sheets and core material are all of a metallic material.

4. The method of claim 2 and further including the step of providing an airflow through the core member to cool the printed circuit board and the drill and to remove cuttings.

5. A method for drilling a printed circuit board comprising
    placing beneath the circuit board, backup material comprising an open core member having an undulating form and a pair of opposing sheets between which the core member is sandwiched, said core member having opposing antinode portions which face against the opposing sheets, the antinode portions running substantially parallel to each other between opposite edges of the sheets, and
    drilling through the printed circuit board and said one sheet of said backup board,
    after drilling through said one sheet of said backup board, ending the travel of the drill in the area of the core member.

6. The method of claim 5 wherein the antinode portions are substantially sinusoidal.

7. The method of claim 6 wherein the sheets and the material of said core member have a thickness of approximately 0.005 inches, the overall thickness of the backup board being approximately 0.063 inches.

* * * * *